(12) United States Patent
Saito

(10) Patent No.: US 9,147,688 B2
(45) Date of Patent: Sep. 29, 2015

(54) SEMICONDUCTOR DEVICE AND METHOD OF MANUFACTURING THE SAME

(71) Applicant: FUJITSU SEMICONDUCTOR LIMITED, Yokohama-shi, Kanagawa (JP)

(72) Inventor: Hitoshi Saito, Hachioji (JP)

(73) Assignee: FUJITSU SEMICONDUCTOR LIMITED, Yokohama (JP)

(*) Notice: Subject to any disclaimer, the term of this patent is extended or adjusted under 35 U.S.C. 154(b) by 0 days.

(21) Appl. No.: 14/579,394

(22) Filed: Dec. 22, 2014

(65) Prior Publication Data
US 2015/0200197 A1 Jul. 16, 2015

(30) Foreign Application Priority Data
Jan. 10, 2014 (JP) .................. 2014-003702

(51) Int. Cl.
*H01L 29/04* (2006.01)
*H01L 29/10* (2006.01)
*H01L 31/00* (2006.01)
*H01L 27/115* (2006.01)
(Continued)

(52) U.S. Cl.
CPC ........ *H01L 27/11502* (2013.01); *H01L 27/108* (2013.01); *H01L 28/60* (2013.01)

(58) Field of Classification Search
USPC ......... 257/751, 774, 762, 200, 758, 288, 298, 257/E21.579, 776, E21.586, 21.579, 773, 257/374, 499–564, 763, 757; 438/762, 639, 438/643, 687, 637, 485, 785, 582, 99, 15, 3, 438/669, 709, 730, 597, 299, 448, 396, 253, 438/200, 642, 638, 640, 627, 648, 622
See application file for complete search history.

(56) References Cited

U.S. PATENT DOCUMENTS

| 5,783,253 A | 7/1998 | Roh |
|---|---|---|
| 6,200,629 B1 | 3/2001 | Sun |

(Continued)

FOREIGN PATENT DOCUMENTS

| JP | 10-098169 A | 4/1998 |
|---|---|---|
| JP | 2002-217381 A | 8/2002 |

(Continued)

OTHER PUBLICATIONS

Extended European Search Report dated May 20, 2015, issued in counterpart Patent Application No. 14200554.5 (7 pages).

*Primary Examiner* — Dao H Nguyen
*Assistant Examiner* — Tram H Nguyen
(74) *Attorney, Agent, or Firm* — Westerman, Hattori, Daniels & Adrian, LLP

(57) ABSTRACT

An embodiment of a compound semiconductor device includes: a first lower electrode; a first insulating film over the first lower electrode; a first upper electrode over the first insulating film; a second lower electrode separate from the first lower electrode; a second insulating film over the second lower electrode; a third insulating film over the second insulating film; and a second upper electrode over on the third insulating film. A thickness of the first insulating film is substantially the same as a thickness of the third insulating film, a contour of the third insulating film in planar view is outside a contour of the second insulating film in planar view, and a contour of the second upper electrode in planar view is inside the contour of the second insulating film in planar view.

15 Claims, 10 Drawing Sheets

(51) Int. Cl.
*H01L 49/02* (2006.01)
*H01L 27/108* (2006.01)

(56) References Cited

U.S. PATENT DOCUMENTS

| | | | |
|---|---|---|---|
| 6,285,050 B1 | 9/2001 | Emma et al. | |
| 6,411,494 B1 | 6/2002 | Watt | |
| 7,915,172 B2* | 3/2011 | Yaegashi | 438/695 |
| 8,148,798 B2* | 4/2012 | Yamagata | 257/532 |
| 8,405,188 B2* | 3/2013 | Wang | 257/532 |
| 2002/0075736 A1 | 6/2002 | Kumura et al. | |
| 2004/0079980 A1 | 4/2004 | Hieda | |
| 2008/0111241 A1* | 5/2008 | Wang | 257/751 |
| 2008/0169571 A1* | 7/2008 | Izumi | 257/774 |
| 2010/0213572 A1 | 8/2010 | Ching et al. | |
| 2012/0056300 A1* | 3/2012 | Ozaki | 257/532 |
| 2012/0175736 A1* | 7/2012 | Watanabe | 257/532 |

FOREIGN PATENT DOCUMENTS

| | | |
|---|---|---|
| JP | 2010-010455 A | 1/2010 |
| JP | 2013-168494 A | 8/2013 |

* cited by examiner

SEMICONDUCTOR DEVICE AND METHOD OF MANUFACTURING THE SAME

CROSS-REFERENCE TO RELATED APPLICATION

This application is based upon and claims the benefit of priority of the prior Japanese Patent Application No. 2014-003702, filed on Jan. 10, 2014, the entire contents of which are incorporated herein by reference.

FIELD

The embodiments discussed herein are directed to a semiconductor device and a method of manufacturing the same.

BACKGROUND

There is a semiconductor device including a memory cell region and a logic circuit region. Memory cells are in the memory cell region, and each memory cell includes a memory capacitor and a transistor. A smoothing capacitor and others are in the logic circuit.

Conventionally, capacitor insulating films which are made of one film are sometimes used for both of a memory capacitor in a memory cell region and a smoothing capacitor in a logic circuit region, when such a semiconductor device is manufactured. In recent years, there has been a demand for a memory capacitor to reduce a thickness of a capacitor insulating film to enable a low-voltage operation, and there has been a demand for a smoothing capacitor to have a capacitor insulating film with a sufficient thickness to suppress a leak current. Thus, it is difficult to use capacitor insulating films which are made of one film for both of a memory capacitor and a smoothing capacitor.

Meanwhile, there is a ferroelectric memory in which a ferroelectric film is used as a capacitor insulating film of a memory capacitor, and a transistor gate structure, in which a silicon oxide film is used as a capacitor insulating film, is adopted for a smoothing capacitor, for example. However, a dielectric constant of a silicon oxide film is significantly lower that a dielectric constant of a ferroelectric film, and it is not possible to achieve sufficient characteristics.

Accordingly, a technique is proposed in which a stack of ferroelectric films is used as a capacitor insulating film of a smoothing capacitor. However, even with this technique, it is difficult to achieve sufficient characteristics with a memory capacitor and a smoothing capacitor.

The problems as above sometimes exist not only in a ferroelectric memory but also in other semiconductor devices such as a DRAM (dynamic random access memory).

Patent Literature 1: Japanese Laid-open Patent Publication No. 2010-10455
Patent Literature 2: Japanese Laid-open Patent Publication No. 2013-168494
Patent Literature 3: Japanese Laid-open Patent Publication No. 10-98169
Patent Literature 4: Japanese Laid-open Patent Publication No. 2002-217381

SUMMARY

According to an aspect of embodiments, a semiconductor device includes: a first lower electrode; a first insulating film over the first lower electrode; a first upper electrode over the first insulating film; a second lower electrode separate from the first lower electrode; a second insulating film over the second lower electrode; a third insulating film over the second insulating film; and a second upper electrode over on the third insulating film. A thickness of the first insulating film is substantially the same as a thickness of the third insulating film, a contour of the third insulating film in planar view is outside a contour of the second insulating film in planar view, and a contour of the second upper electrode in planar view is inside the contour of the second insulating film in planar view.

According to another aspect of embodiments, in a method of manufacturing a semiconductor device: a first conductive film is formed; a second insulating film is formed over the first conductive film; a dielectric film that covers the second insulating film is formed over the first conductive film; the dielectric film is processed so as to form a third insulating film that covers the second insulating film over the first conductive film, and form a first insulating film separate from the third insulating film over the first conductive film; a second conductive film is formed over the first insulating film and the third insulating film; the second conductive film is processed so as to form a first upper electrode over the first insulating film, and form a second upper electrode over the third insulating film; and the first conductive film is processed so as to form a first lower electrode under the first insulating film, and form a second lower electrode under the second insulating film. A contour of the third insulating film in planar view is outside a contour of the second insulating film in planar view, and a contour of the second upper electrode in planar view is inside the contour of the second insulating film in planar view.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The inventor of the present application conducted earnest studies regarding the reason why it is not possible to achieve sufficient characteristics even with a conventional technique such that a stack of ferroelectric films is used as a capacitor insulating film of a smoothing capacitor. As a result of this, it was clarified that an etching damage which occurred during forming the capacitor insulating film on the memory cell capacitor and the smoothing capacitor remains severely in the conventional technique. Then, the inventor further conducted earnest studies to enable suppression of the etching damage as above, and as a result of this, the inventor arrived at the following embodiments.

Hereinafter, embodiments will be concretely described while referring to the attached drawings.

First Embodiment

Figure 1A:
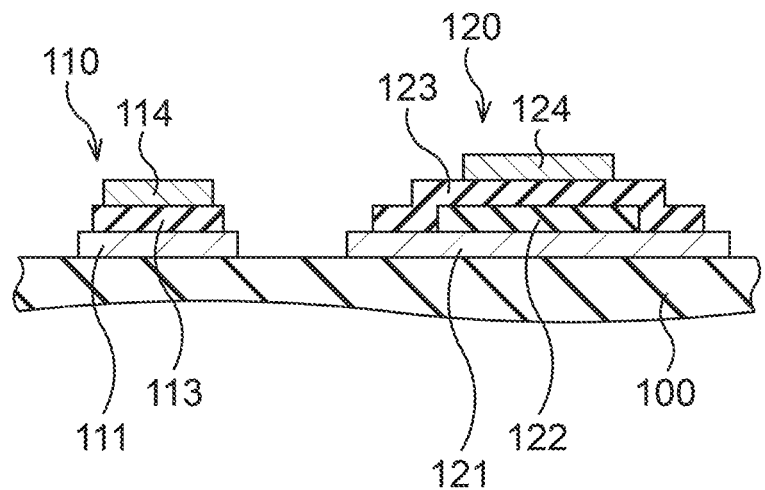
FIG. 1A is a sectional view illustrating a semiconductor device according to a first embodiment.
Figure 1B:
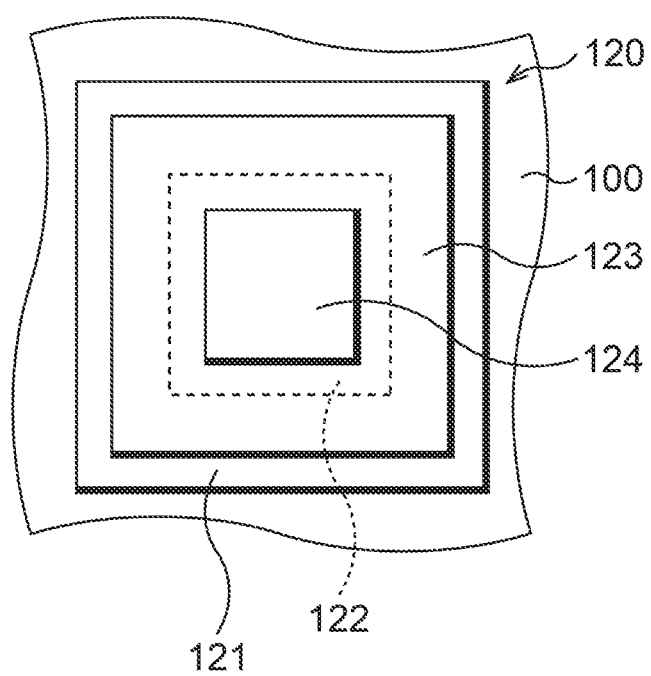
FIG. 1B is a planar view illustrating the semiconductor device according to the first embodiment.

First, a first embodiment will be described. FIG. 1A and FIG. 1B are diagrams illustrating a semiconductor device according to the first embodiment. FIG. 1A is a sectional view, and FIG. 1B is a plan view.

As illustrated in FIG. 1A and FIG. 1B, a first capacitor 110 and a second capacitor 120 are formed over a base 100 in the first embodiment. The first capacitor 110 includes a first lower electrode 111, a first insulating film 113 over the first lower electrode 111, and a first upper electrode 114 over the first insulating film 113. The second capacitor 120 includes a second lower electrode 121, a second insulating film 122 over the second lower electrode 121, a third insulating film 123 over the second insulating film 122, and a second upper electrode 124 over the third insulating film 123. A thickness of the first insulating film 113 is substantially the same as a thickness of the third insulating film 123, a contour of the third insulating film 123 in planar view is outside a contour of the second insulating film 122 in planar view, and a contour of the second upper electrode 124 in planar view is inside the contour of the second insulating film 122 in planar view.

In the first embodiment configured as above, the second insulating film 122, in addition to the third insulating film 123, exists between the lower electrode 121 and the upper electrode 124 of the second capacitor 120, while the first insulating film 113 exists between the lower electrode 111 and the upper electrode 114 of the first capacitor 110. Therefore, it is possible to set the second insulating film 122 to have a thickness suitable for reducing a leak current while setting the first insulating film 113 to have a thickness suitable for a low-voltage operation. Further, since the contour of the second upper electrode 124 in planar view is inside the contour of the second insulating film 122 in planar view, even if an etching damage exists in a peripheral edge portion of the second insulating film 122, the characteristics of the second capacitor 120 are difficult to be lowered. Moreover, since the thickness of the third insulating film 123 is substantially the same as the thickness of the first insulating film 113, and the contour of the third insulating film 123 in planar view is outside the contour of the second insulating film 122 in planar view, the etching of the first insulating film 113 and the etching of the third insulating film 123 can be completed with an equal amount of time needed, when the device is manufactured. Specifically, the reduction in the characteristics caused by overetching can be suppressed.

Second Embodiment

Figure 2A:
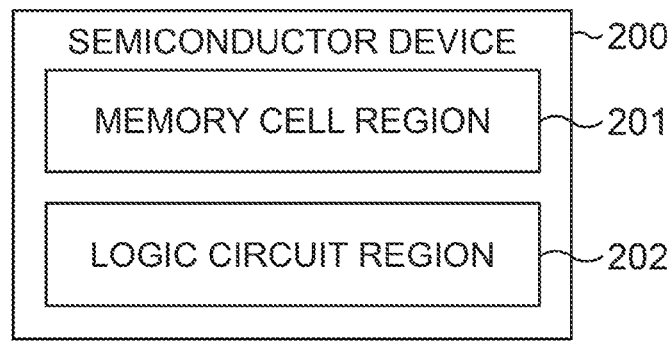
FIG. 2A is a block diagram illustrating a semiconductor device according to a second embodiment.
Figure 2B:
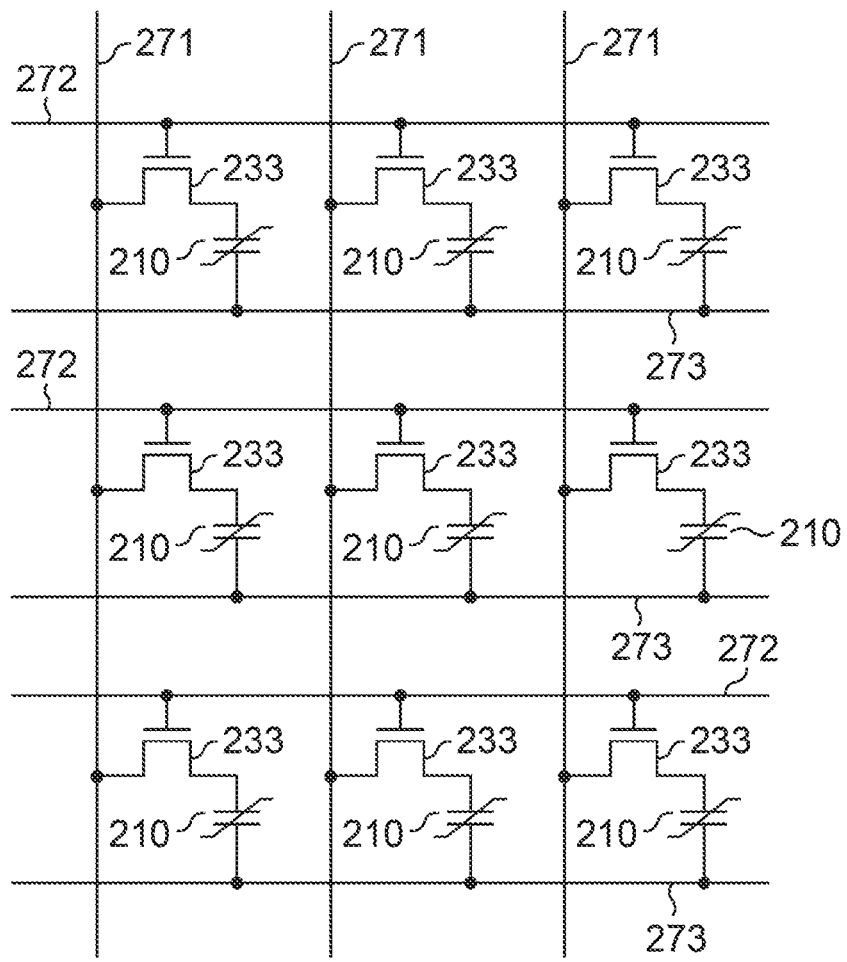
FIG. 2B is a circuit diagram illustrating the semiconductor device according to the second embodiment.
Figure 3:
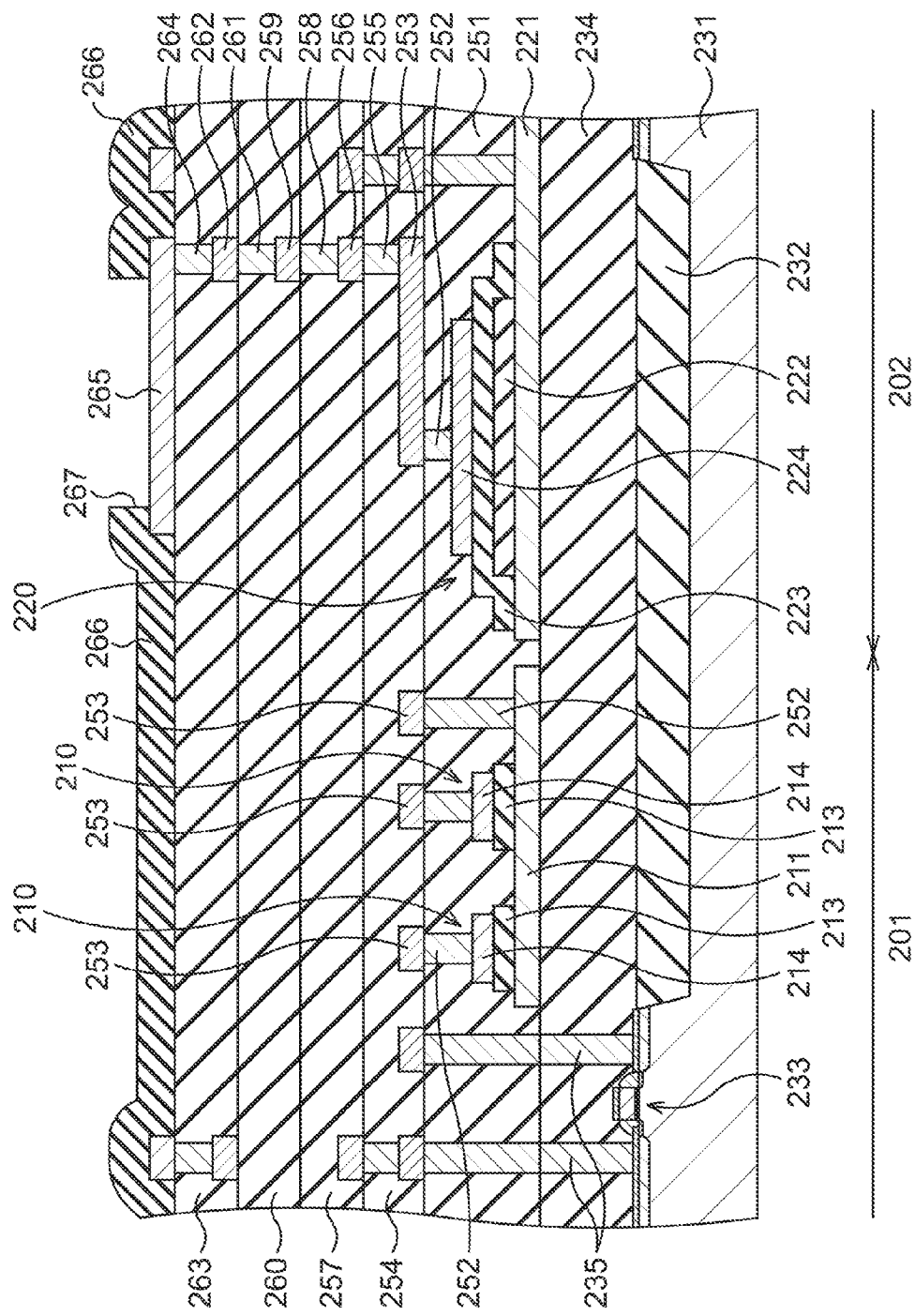
FIG. 3 is a sectional view illustrating a structure of the semiconductor device according to the second embodiment.

Next, a second embodiment will be described. The second embodiment corresponds to an example of a ferroelectric memory. FIG. 2A and FIG. 2B are diagrams illustrating a semiconductor device according to the second embodiment. FIG. 2A is a block diagram, and FIG. 2B is a circuit diagram illustrating a configuration of a memory cell region. FIG. 3 is a sectional view illustrating a structure of the semiconductor device according to the second embodiment. As illustrated in FIG. 2A, a semiconductor device 200 according to the second embodiment is provided with a memory cell region 201 and a logic circuit region 202.

As illustrated in FIG. 2B, the memory cell region 201 is provided with bit lines 271 extending in one direction, and is further provided with word lines 272 and plate lines 273 which intersect with the bit lines 271. Memory cells are arranged in an array state so as to match grids formed by the bit lines 271, word lines 272 and plate lines 273. Each memory cell is provided with a memory capacitor 210 and a memory transistor 233.

A gate of the memory transistor 233 is connected to the word line 272. One of a source and a drain of the memory transistor 233 is connected to the bit line 271, and the other one of the source and the drain of the memory transistor 233 is connected to one electrode of the memory capacitor 210. The other electrode of the memory capacitor 210 is connected to the plate line 273. The respective word lines 272 and plate lines 273 are shared by the memory cells arranged in a direction same as a direction in which the respective word lines 272 and plate lines 273 extend. Similarly, the respective bit lines 271 are shared by the memory cells arranged in a direction same as a direction in which the respective bit lines 271 extend. However, the arrangement of the bit lines 271, the word lines 272 and the plate lines 273 is not limited to the above-described arrangement.

In the memory cell region 201 of the ferroelectric memory configured as above, data is stored in accordance with a polarization state of a capacitor insulating film in the memory capacitor 210.

The logic circuit region 202 is provided with a smoothing capacitor 220 and others. A capacitance of the smoothing capacitor 220 is larger than a capacitance of the memory capacitor 210.

As illustrated in FIG. 3, an element isolation region 232 is formed over a surface of a semiconductor substrate 231 such as a silicon substrate in the semiconductor device 200. Memory transistors 233 are formed on the surface of the semiconductor substrate 231 in an active region defined by the element isolation region 232 in the memory cell region 201. A MOS (metal-oxide-semiconductor) type field-effect transistor is used for the memory transistor 233, for example. FIG. 3 illustrates only one memory transistor 233, for the sake of convenience. An interlayer insulating film 234 that covers the semiconductor substrate 231 is formed. Conductive plugs 235 are formed in the interlayer insulating film 234. At least a part of the conductive plugs 235 is electrically connected to the source or the drain of the memory transistor 233.

A lower electrode 211 is formed over the interlayer insulating film 234, capacitor insulating films 213 are formed over the lower electrode 211, and an upper electrode 214 is formed over each of the capacitor insulating films 213 in the memory cell region 201. Thus, the memory capacitors 210 are formed over the interlayer insulating film 234. For the sake of convenience, FIG. 3 illustrates only two memory capacitors 210. The lower electrode 211 is an example of a first lower electrode, the capacitor insulating film 213 is an example of a first insulating film, and the upper electrode 214 is an example of a first upper electrode.

A lower electrode 221 is formed over the interlayer insulating film 234, a lower capacitor insulating film 222 is formed over the lower electrode 221, an upper capacitor insulating film 223 is formed over the lower capacitor insulating film 222, and an upper electrode 224 is formed over the upper capacitor insulating film 223 in the logic circuit region 202. A thickness of the upper capacitor insulating film 223 is substantially the same as a thickness of the capacitor insulating film 213, a contour of the upper capacitor insulating film 223 in planar view is outside a contour of the lower capacitor insulating film 222 in planar view, and a contour of the upper electrode 224 in planar view is inside a contour of the lower capacitor in planar view insulating film 222. Thus, the smoothing capacitor 220 is formed over the interlayer insulating film 234. For example, an area of the upper electrode 224 of the smoothing capacitor is larger than an area of the upper electrode 214 of the memory capacitor 210. For example, the lower capacitor insulating film 222 is thicker than the capacitor insulating film 213 and the upper capacitor insulating film 223. The lower electrode 221 is an example of a second lower electrode, the lower capacitor insulating film 222 is an example of a second insulating film, the upper capacitor insulating film 223 is an example of a third insulating film, and the upper electrode 224 is an example of a second upper electrode.

An interlayer insulating film 251 that covers the memory capacitors 210 and the smoothing capacitors 220 is formed over the interlayer insulating film 234. Conductive plugs 252 are formed in the interlayer insulating film 251. A part of the conductive plugs 252 is electrically connected to the conductive plug 235, another part of the conductive plugs 252 is electrically connected to the upper electrode 214, another part of the conductive plugs 252 is electrically connected to the lower electrode 211, another part of the conductive plugs 252 is electrically connected to the upper electrode 224, and another part of the conductive plugs 252 is electrically connected to the lower electrode 221.

Conductive films 253 electrically connected to the conductive plugs 252 are formed over the interlayer insulating film 251. An interlayer insulating film 254 that covers the conductive films 253 is formed over the interlayer insulating film 251. Conductive plugs 255 electrically connected to the conductive films 253 are formed in the interlayer insulating film 254. Conductive films 256, an interlayer insulating film 257, conductive plugs 258, conductive films 259, an interlayer insulating film 260, conductive plugs 261, conductive films 262, an interlayer insulating film 263, and conductive plugs 264 are formed over the interlayer insulating film 254 in a similar manner.

A bonding pad 265 electrically connected to the conductive plug 264 is formed over the interlayer insulating film 263. Further, a passivation film 266 with an opening 267 that exposes a part of the bonding pad 265 is formed over the interlayer insulating film 263.

In the second embodiment configured as above, the lower capacitor insulating film 222, in addition to the upper capacitor insulating film 223, exists between the lower electrode 221 and the upper electrode 224 of the smoothing capacitor 220, while the capacitor insulating film 213 exists between the lower electrode 211 and the upper electrode 214 of the memory capacitor 210. Therefore, it is possible to set the lower capacitor insulating film 222 to have a thickness suitable for reducing a leak current while setting the capacitor insulating film 213 to have a thickness suitable for a low-voltage operation. Further, although details will be described later, since the contour of the upper electrode 224 in planar view is inside the contour of the lower capacitor insulating film 222 in planar view, even if an etching damage exists in a peripheral edge portion of the lower capacitor insulating film 222, the characteristics of the smoothing capacitor 220 are difficult to be lowered. Moreover, since the thickness of the upper capacitor insulating film 223 is substantially the same as the thickness of the capacitor insulating film 213, and the contour of the upper capacitor insulating film 223 in planar view is outside the contour of the lower capacitor insulating film 222 in planar view, the etching of the capacitor insulating film 213 and the etching of the upper capacitor insulating film 223 can be completed with an equal amount of time needed, when the device is manufactured. Specifically, the reduction in the characteristics caused by overetching can be suppressed.

The semiconductor device 200 is provided with the memory cell region 201 and the logic circuit region 202, and the logic circuit region 202 includes the smoothing capacitor 220, so that there is no need to additionally provide a region for a smoothing capacitor other than the memory cell region 201 and the logic circuit region 202. Further, while obtaining such an effect, it is possible to suppress increase in manufacturing cost and reduction in performance of the memory capacitor, and to reduce a chip size.

In order to make the etching of the capacitor insulating film 213 and the etching of the upper capacitor insulating film 223 to be more securely completed with an equal amount of time needed, a distance between the contour of the upper capacitor insulating film 223 and the contour of the lower capacitor insulating film 222 is preferably twice or more as large as the thickness of the upper capacitor insulating film 223. Specifically, if the thickness of the upper capacitor insulating film 223 is 100 nm, for example, it is preferable to make the contour of the upper capacitor insulating film 223 to be separate from the contour of the lower capacitor insulating film 222 by 200 nm or more.

Generally, an electrostatic capacitance Q (F) of a parallel-plate capacitor is in proportion to an area S (m$^2$) of electrode plates, and is in inverse proportion to a distance D (m) between the electrode plates. Further, when an electric constant is denoted by $\in_0$ (=8.854×10$^{-12}$ (F/m)), and a relative dielectric constant of a substance composing the capacitor insulating film is denoted by $\in_r$, the electrostatic capacitance Q (F) can be represented by the following equation 1.

$$Q = \in_0 \times \in_r \times (S/D) \quad \text{(Equation 1)}$$

When an electrostatic capacitance Q1 of a smoothing capacitor with a transistor gate structure in which a silicon oxide film is used as a capacitor insulating film and an electrostatic capacitance Q2 of the smoothing capacitor 220 of the second embodiment are compared, the following result is obtained. A relative dielectric constant $\in_r$ of the silicon oxide film is 3.5, a relative dielectric constant $\in_r$ of PZT is about 1400. Generally, a distance D under a design rule in which a gate length of a transistor is 0.18 μm is 2.5 nm to 5 nm, and in this case, the distance D is assumed to be 2.5 nm, which is the smallest value. The distance D of the smoothing capacitor 220 of the second embodiment corresponds to a sum of the thickness of the lower capacitor insulating film 222 and the thickness of the upper capacitor insulating film 223, and is 175 nm, for example. The electrostatic capacitance Q1 and the electrostatic capacitance Q2 are determined in the following manner.

$$Q1 = 8.854 \times 10^{-12} \times 3.5 \times (S/2.5 \times 10^{-9})$$
$$= 1.24 \times 10^{-2} \times S$$
$$Q2 = 8.854 \times 10^{-12} \times 1400 \times (S/175 \times 10^{-9})$$
$$= 7.08 \times 10^{-2} \times S$$

As described above, according to the second embodiment, it is possible to obtain a sufficiently high electrostatic capacitance, when compared to the smoothing capacitor with the transistor gate structure. Therefore, even if the semiconductor device is further miniaturized, sufficient characteristics can be exhibited.

The lower capacitor insulating film 222 and the upper capacitor insulating film 223 in the smoothing capacitor 220 have polarization characteristics of ferroelectric, but they can be used within a range in which the polarization characteristics does not influence smoothing characteristics of the smoothing capacitor 220. This is because a voltage applied to the smoothing capacitor 220 is normally relatively high.

Next, a method of manufacturing the semiconductor device according to the second embodiment will be described. FIG. 4A to FIG. 4L are sectional views illustrating the method of manufacturing the semiconductor device according to the second embodiment in the order of steps. FIG. 5A to FIG. 5H are plan views illustrating the method of manufacturing the semiconductor device according to the second embodiment in the order of steps.

Figure 4A:
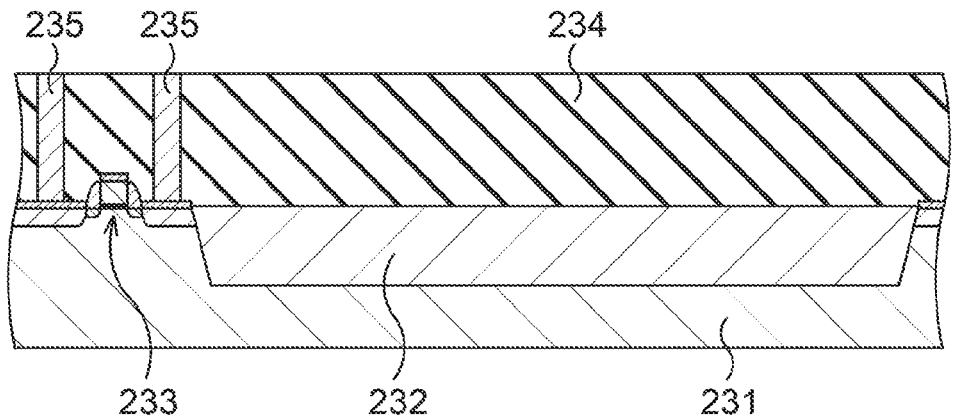
FIG. 4A to FIG. 4L are sectional views illustrating a method of manufacturing the semiconductor device according to the second embodiment in the order of steps.

First, as illustrated in FIG. 4A, the element isolation region 232 is selectively formed on the surface of the semiconductor substrate 231. Then, the memory transistors 233 are formed on the surface of the semiconductor substrate 231 in the active region in the memory cell region 201. Thereafter, the interlayer insulating film 234 that covers the semiconductor substrate 231 is formed by a chemical vapor deposition (CVD) method, for example. A thickness of the interlayer insulating film 234 is about 500 nm, for example. BPSG (boro-phospho silicate glass) and PSG (phospho silicate glass) may be exemplified as a material of the interlayer insulating film 234, for example. Further, a silicon oxide film may be formed by a high density plasma-CVD method (HDP-CVD), and a silicon oxide film may be formed with TEOS (tetraethylorthosilicate) and $O_3$. Subsequently, etching using $CF_4$, $C_2F_6$, or $C_4F_8$-based gas is performed to form contact holes in the interlayer insulating film 234, and the conductive plugs 235 are formed in the contact holes. The conductive plug 235 may be formed by filling a metal film such as a tungsten film, for example, in the contact hole by a CVD method or the like.

Figure 4B:
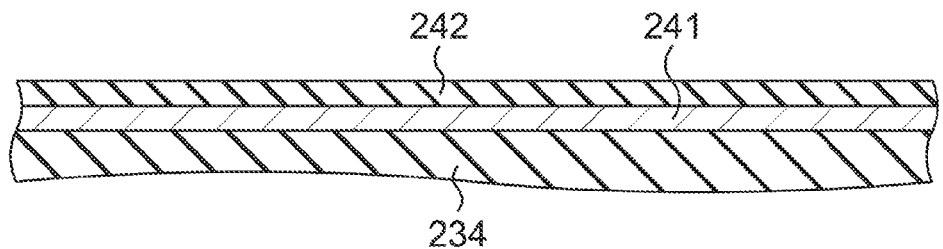

Then, as illustrated in FIG. 4B, a conductive film 241 such as a Pt film electrically connected to the conductive plugs 235 is formed over the interlayer insulating film 234. A thickness of the conductive film 241 is about 100 nm, for example. The conductive film 241 may be formed by a sputtering method, for example. Then, a ferroelectric film 242 such as a lead zirconate titanate (PZT) film is formed over the conductive film 241. A thickness of the ferroelectric film 242 is about 10 nm to 75 nm, for example. The ferroelectric film 242 may be formed by a sputtering method or a metal organic chemical vapor deposition (MOCVD) method, for example.

Figure 4C:
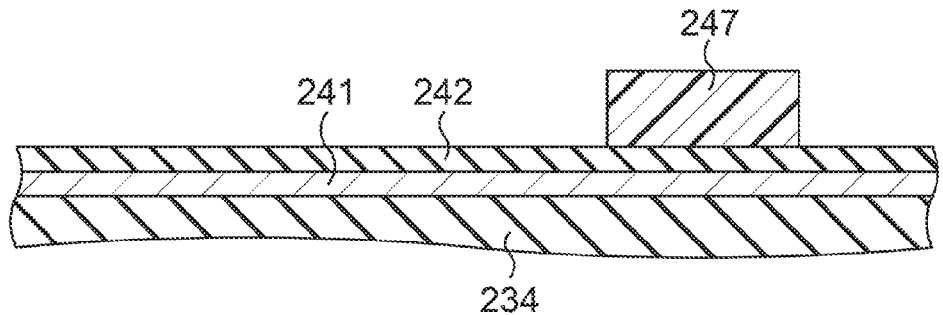
Figure 5A:
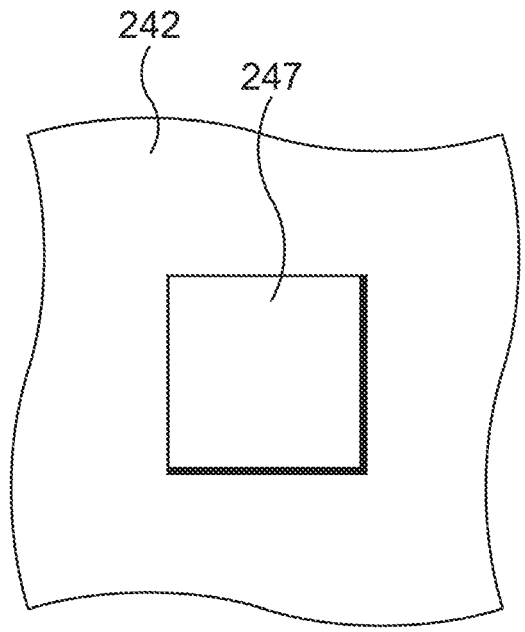
FIG. 5A to FIG. 5H are planar views illustrating the method of manufacturing the semiconductor device according to the second embodiment in the order of steps.

Subsequently, as illustrated in FIG. 4C and FIG. 5A, a mask 247 that covers a region where the lower capacitor insulating film of the smoothing capacitor 220 is to be formed and exposes the other region is formed over the ferroelectric film 242.

Figure 4D:
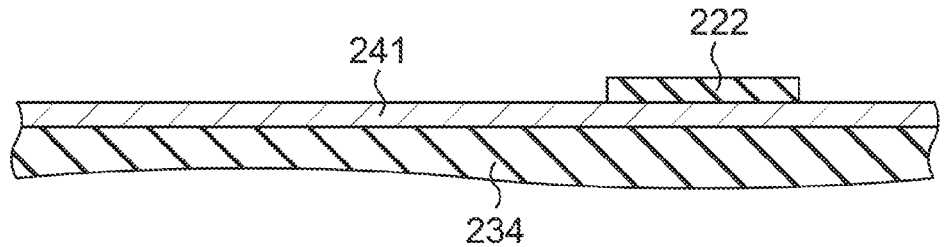
Figure 5B:
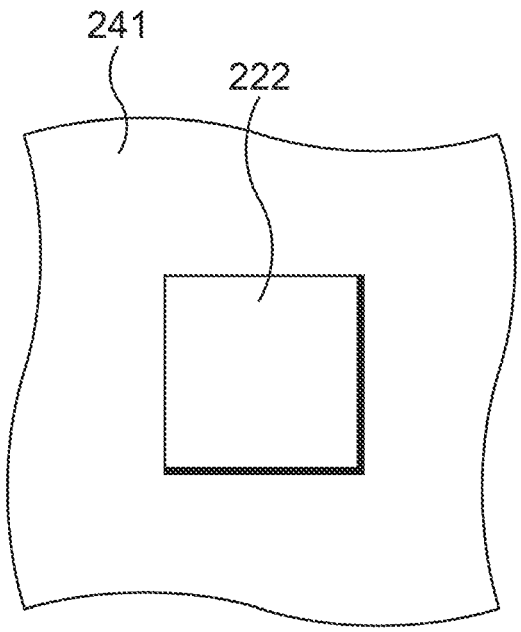

Then, as illustrated in FIG. 4D and FIG. 5B, the ferroelectric film 242 is etching so as to form the lower capacitor insulating film 222. Subsequently, the mask 247 is removed.

Figure 4E:
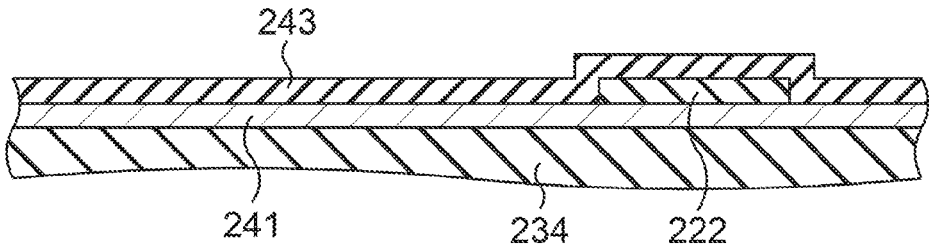
Figure 5C:
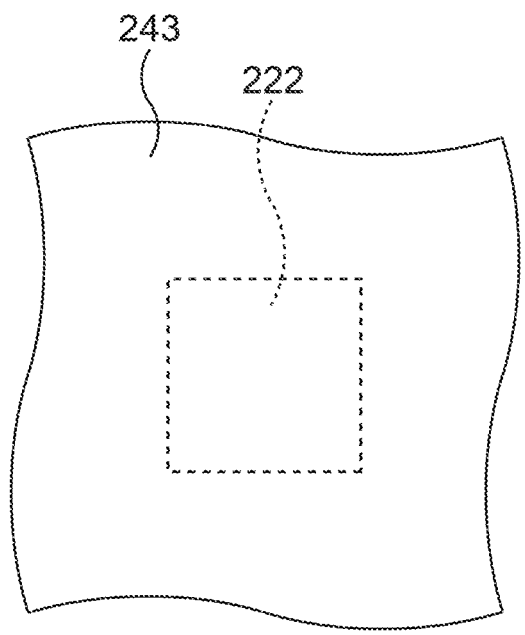

Thereafter, as illustrated in FIG. 4E and FIG. 5C, a ferroelectric film 243 such as a lead zirconate titanate (PZT) film that covers the lower capacitor insulating film 222 is formed over the conductive film 241. A thickness of the ferroelectric film 243 is about 50 nm to 100 nm, for example. The ferroelectric film 243 may also be formed by a sputtering method or an MOCVD method, for example. Subsequently, annealing treatment is performed at a temperature within a predetermined temperature range so as to make a crystal structure of the ferroelectric film 243 and the lower capacitor insulating film 222 to be a layered perovskite structure. As an example of the annealing treatment, the semiconductor substrate 231 is heated under normal pressure in oxygen atmosphere.

Figure 4F:
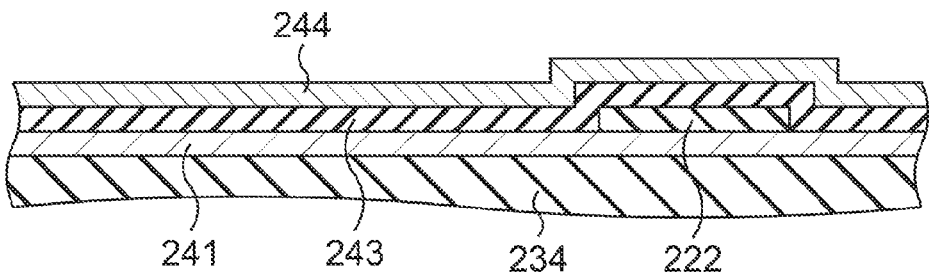
Figure 5D:
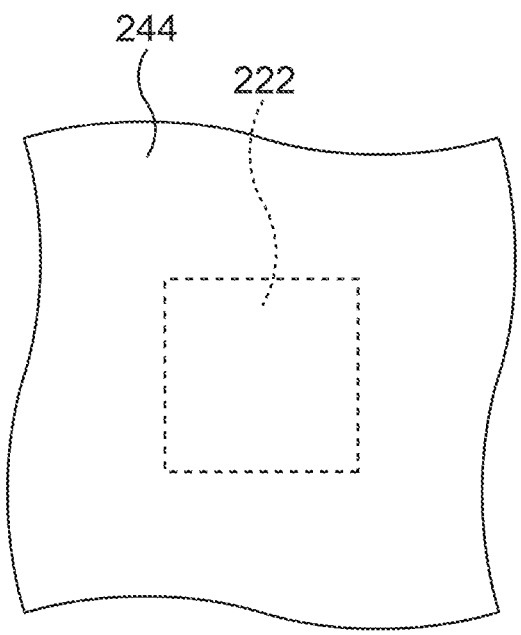

Then, as illustrated in FIG. 4F and FIG. 5D, a conductive film 244 such as an iridium oxide film is formed over the ferroelectric film 243.

Figure 4G:
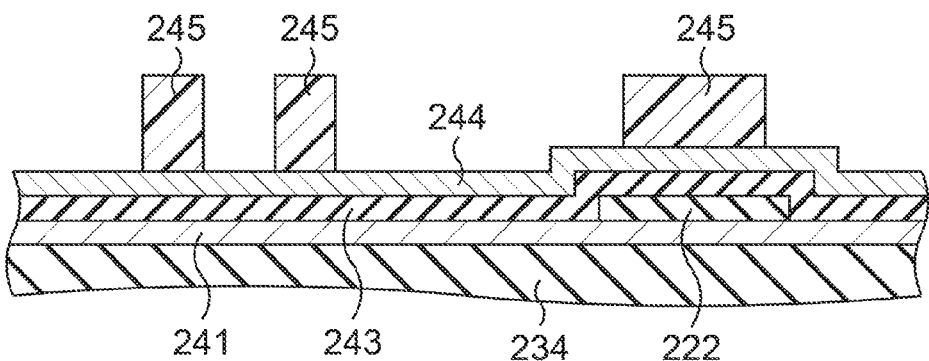
Figure 5E:
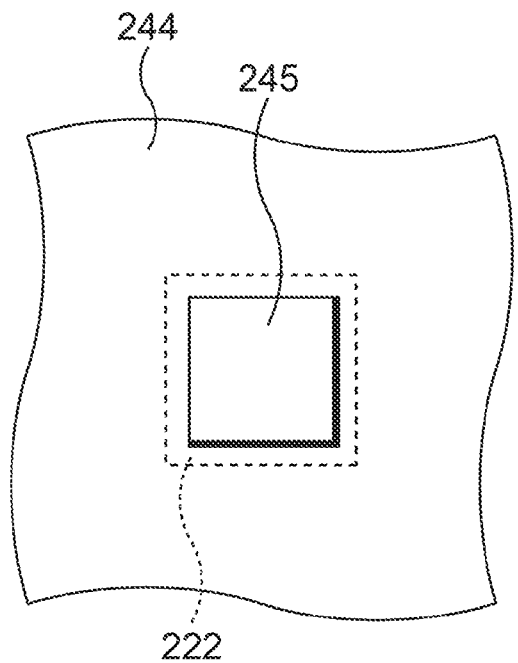

Thereafter, as illustrated in FIG. 4G and FIG. 5E, a mask that covers regions where the upper electrodes of the memory capacitors 210 are to be formed and a region where the upper electrode of the smoothing capacitor 220 is to be formed and exposes the other region is formed over the conductive film 244.

Figure 4H:
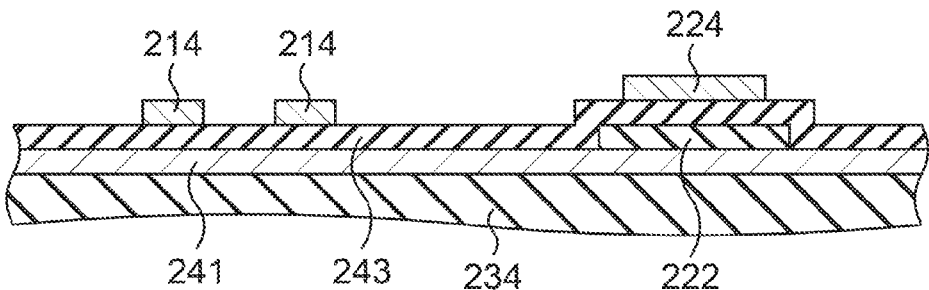
Figure 5F:
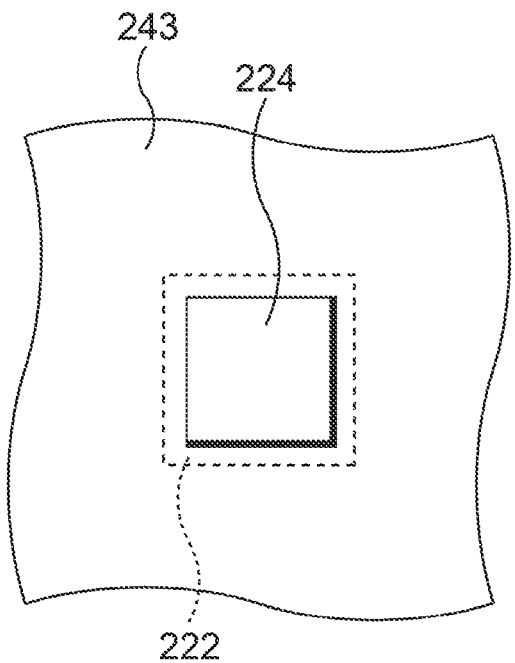

Subsequently, as illustrated in FIG. 4H and FIG. 5F, the conductive film 244 is etching so as to form the upper electrodes 214 and the upper electrode 224. Subsequently, the mask 245 is removed.

Figure 4I:
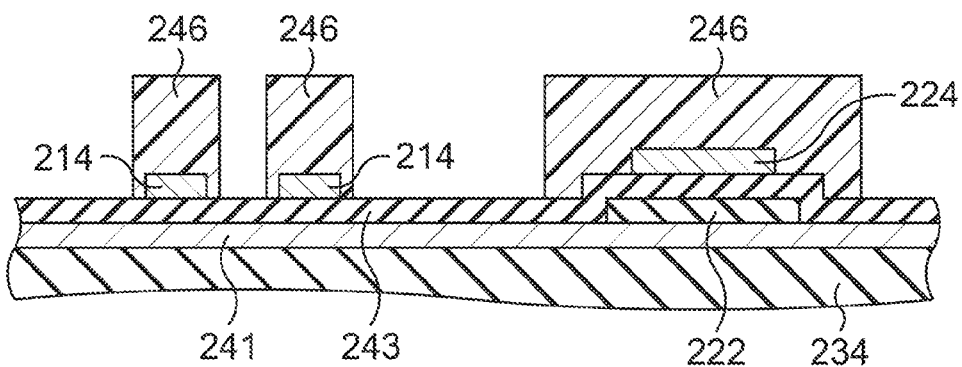
Figure 5G:
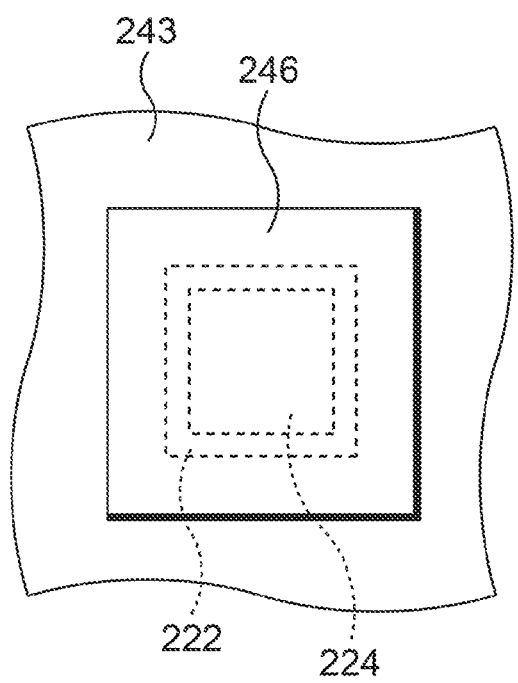

Then, as illustrated in FIG. 4I and FIG. 5G, a mask 246 that covers regions where the capacitor insulating films of the memory capacitors 210 are to be formed and a region where the upper capacitor insulating film of the smoothing capacitor 220 is to be formed and exposes the other region is formed over the ferroelectric film 243.

Figure 4J:
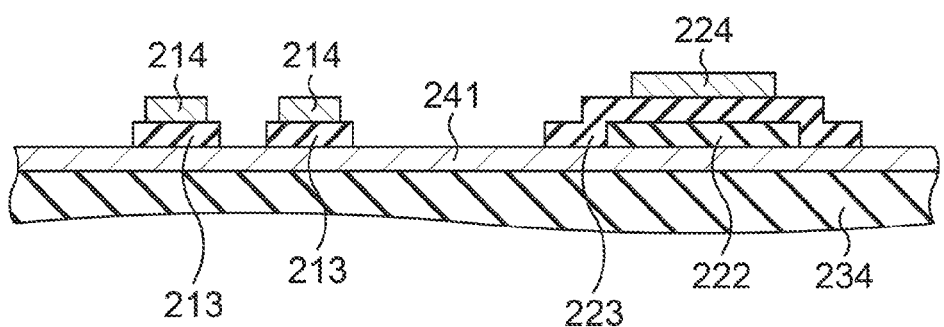
Figure 5H:
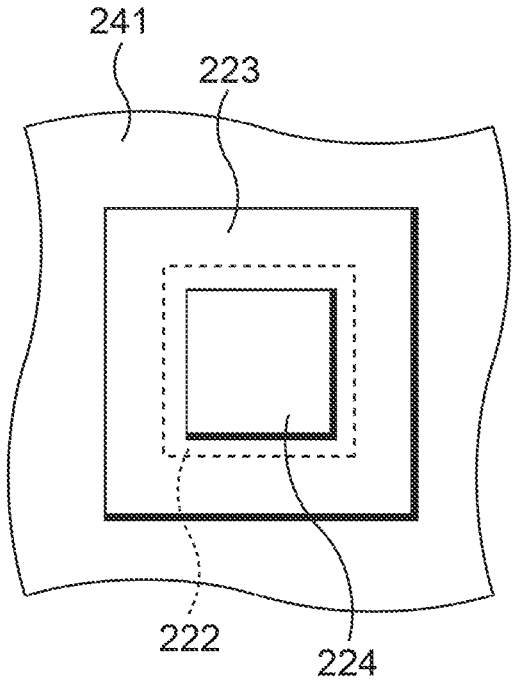

Thereafter, as illustrated in FIG. 4J and FIG. 5H, the ferroelectric film 243 is etching so as to form the capacitor insulating films 213 and the upper capacitor insulating film 223. Subsequently, the mask 246 is removed.

Figure 4K:
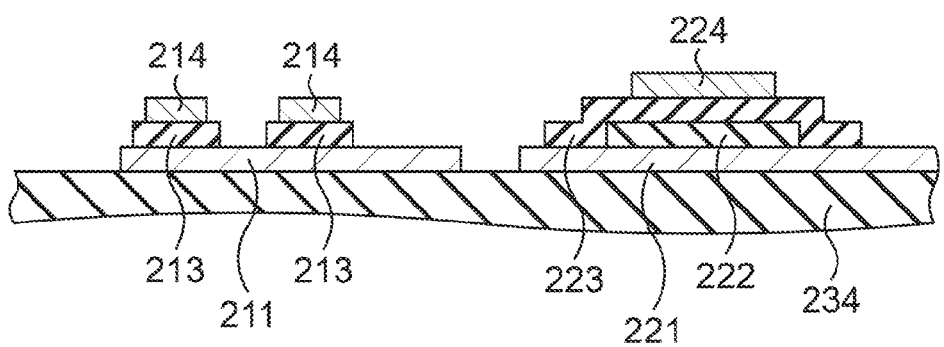

Subsequently, as illustrated in FIG. 4K, the conductive film 241 is etching using a mask so as to form the lower electrode 211 and the lower electrode 221. In the manner as described above, the memory capacitor 210 and the smoothing capacitor 220 are obtained.

Figure 4L:
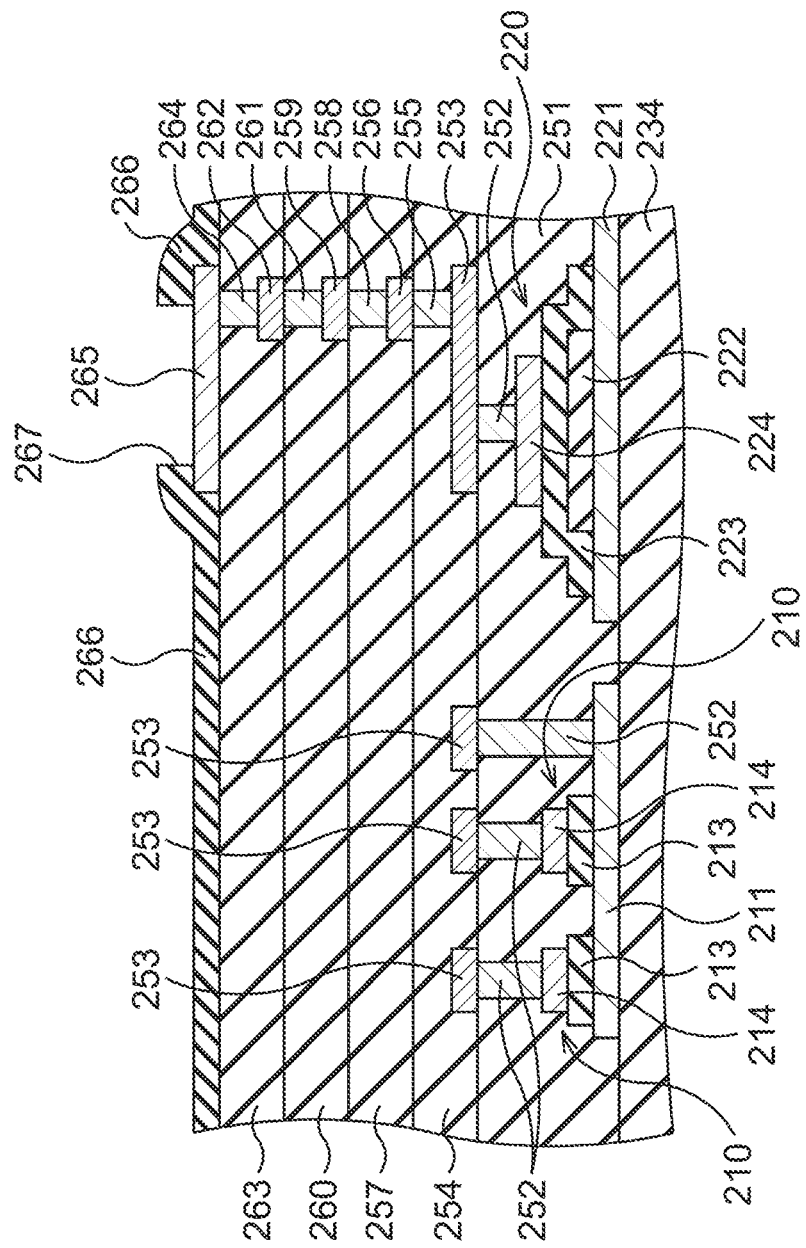

Then, as illustrated in FIG. 4L, the interlayer insulating film 251 that covers the memory capacitors 210 and the smoothing capacitor 220 is formed over the interlayer insulating film 234. Thereafter, the conductive plugs 252 are formed in the interlayer insulating film 251. Subsequently, the conductive films 253 electrically connected to the conductive plugs 252 are formed on the interlayer insulating film 251. Subsequently, the interlayer insulating film 254, the conductive plugs 255, the conductive films 256, the interlayer insulating film 257, the conductive plugs 258, the conductive films 259, the interlayer insulating film 260, the conductive plugs 261, the conductive films 262, the interlayer insulating film 263, and the conductive plugs 264 are formed in a similar manner. The interlayer insulating films 251, 254, 257, 260 and 263 may be formed in a similar manner to that of the interlayer insulating film 234, for example. The conductive plugs 252, 255, 258, 261 and 264 may be formed in a similar manner to that of the conductive plug 235, for example. As a material of the conductive films 253, 256, 259 and 262, Al, Cu and the like may be exemplified. Further, the bonding pad 265 electrically connected to the conductive plug 264 is formed over the interlayer insulating film 263. Then, the passivation film 266 that covers the bonding pad 265 is formed over the interlayer insulating film 263, and the opening 267 that exposes a part of the bonding pad 265 is formed in the interlayer insulating film 263.

The semiconductor device is completed in the manner as described above.

According to the manufacturing method as described above, the smoothing capacitor 220 can be formed in parallel with the memory capacitor 210, so that it is possible to form the smoothing capacitor 220 within the logic circuit region 202. Therefore, there is no need to provide a dedicated region necessary for a smoothing capacitor which employs the transistor gate structure, resulting in that the chip size can be reduced.

Further, the etching damage is difficult to occur on the portion, of each of the memory capacitor 210 and the smoothing capacitor 220, at which an electric charge of the capacitor insulating film is accumulated, so that good characteristics can be obtained.

Figure 6:
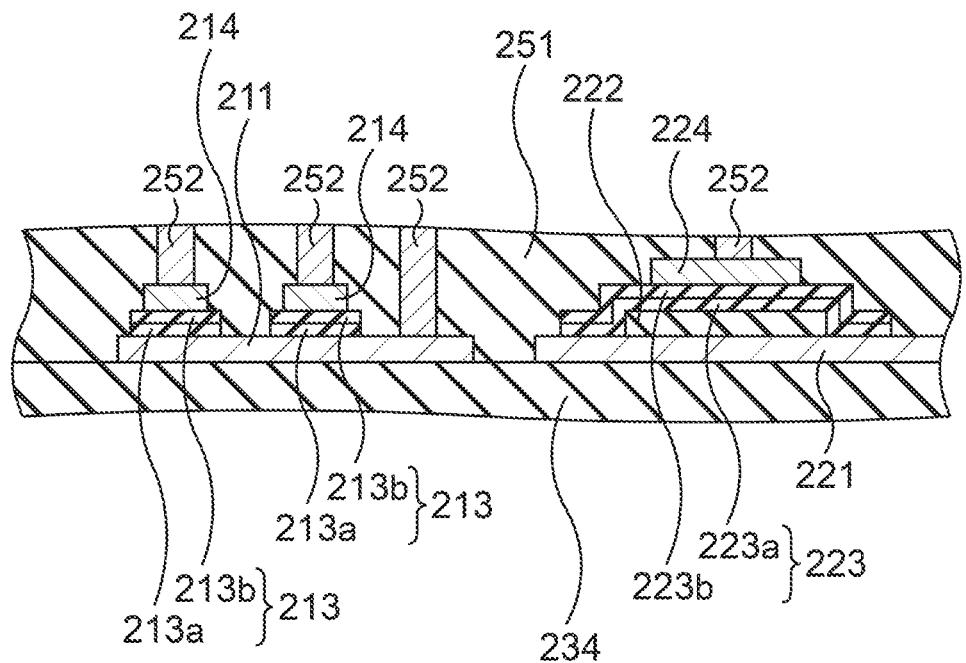
FIG. 6 is a sectional view illustrating a modified example of the second embodiment.

The capacitor insulating film 213 may include a film 213a and a film 213b, and the upper capacitor insulating film 223 may include a film 223a and a film 223b, as illustrated in FIG. 6. In this case, a thickness of the film 223a is substantially the same as a thickness of the film 213a, and a thickness of the film 223b is substantially the same as a thickness of the film 213b. In manufacturing such a semiconductor device, when the ferroelectric film 243 is formed (FIG. 4E), a ferroelectric film to be the film 213a and the film 223a is formed, and another ferroelectric film to be the film 213b and the film 223b is formed over the ferroelectric film, for example. The composition may be different or the film formation condition may be different between these two types of ferroelectric films. Further, annealing may be conducted after forming the ferroelectric film to be the film 213a and the film 223a, and thereafter, the ferroelectric film to be the film 213b and the film 223b may be formed. Each of the capacitor insulating film 213 and the upper capacitor insulating film 223 may also include three or more of films.

Figure 7:
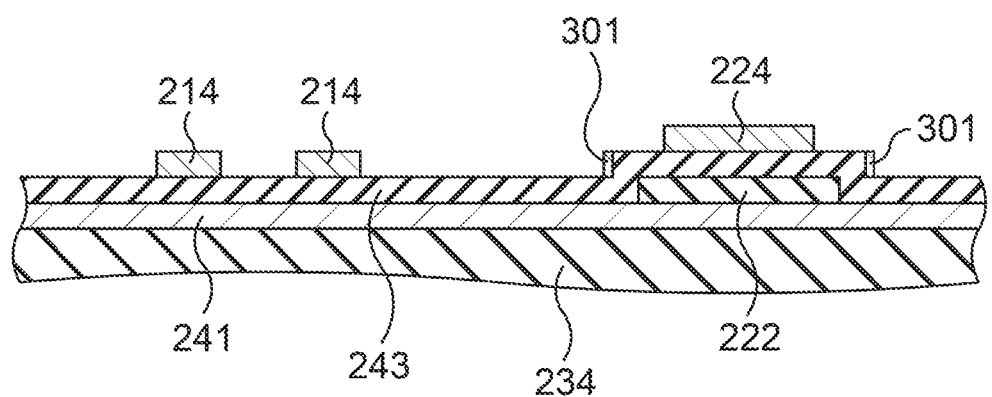
FIG. 7 is a sectional view illustrating another modified example of the second embodiment.

Further, a remaining portion 301 of the conductive film 244 may be remained on sides of a bump of the ferroelectric film 243 after the conductive film 244 is etched to form the upper electrode 214 and the upper electrode 224, as illustrated in FIG. 7.

The ferroelectric used for the ferroelectric capacitor is not limited to PZT, and PZT to which La, Ca or the like is added may be used. Further, bismuth titanate or the like may be used. The memory capacitor is not limited to a ferroelectric capacitor, and it may also be a high-dielectric memory capacitor or a paraelectric memory capacitor, for example. A high-dielectric memory capacitor and a paraelectric memory capacitor are used for a DRAM (dynamic random access memory), for example. Further, when a structure similar to that of the smoothing capacitor in each of the embodiments is applied to a protection capacitor provided in a protection circuit region of a semiconductor element such as a transistor, a similar effect can be achieved.

According to the above-described semiconductor device and the like, since the appropriate first insulating film, second insulating film, and third insulating film are provided, it is possible to easily manufacture a plurality of capacitors having good characteristics and having mutually different forms.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A semiconductor device, comprising:
   a first lower electrode;
   a first insulating film over the first lower electrode;
   a first upper electrode over the first insulating film;
   a second lower electrode separate from the first lower electrode;
   a second insulating film over the second lower electrode;
   a third insulating film over the second insulating film; and
   a second upper electrode over on the third insulating film,
   wherein:
   a thickness of the first insulating film is substantially the same as a thickness of the third insulating film;
   a contour of the third insulating film in planar view is outside a contour of the second insulating film in planar view; and
   a contour of the second upper electrode in planar view is inside the contour of the second insulating film in planar view.

2. The semiconductor device according to claim 1, wherein each of the first insulating film, the second insulating film, and the third insulating film is a ferroelectric film.

3. The semiconductor device according to claim 1, wherein each of the first insulating film and the third insulating film includes a plurality of films.

4. The semiconductor device according to claim 1, wherein a distance between the contour of the third insulating film in planar view and the contour of the second insulating film in planar view is twice or more as large as the thickness of the third insulating film.

5. The semiconductor device according to claim 1, wherein:
   the first lower electrode, the first insulating film, and the first upper electrode are in a memory cell region; and
   the second lower electrode, the second insulating film, the third insulating film, and the second upper electrode are in a logic circuit region.

6. The semiconductor device according to claim 1, wherein the first insulating film and the third insulating film are formed by etching one dielectric film.

7. The semiconductor device according to claim 1, wherein the second insulating film is thicker than the first insulating film and the third insulating film.

8. The semiconductor device according to claim 1, wherein an area of the second upper electrode is larger than an area of the first upper electrode.

9. A method of manufacturing a semiconductor device, comprising:
   forming a first conductive film;
   forming a second insulating film over the first conductive film;
   forming a dielectric film that covers the second insulating film over the first conductive film;
   processing the dielectric film so as to form a third insulating film that covers the second insulating film over the first conductive film, and form a first insulating film separate from the third insulating film over the first conductive film;
   forming a second conductive film over the first insulating film and the third insulating film;
   processing the second conductive film so as to form a first upper electrode over the first insulating film, and form a second upper electrode over the third insulating film; and
   processing the first conductive film so as to form a first lower electrode under the first insulating film, and form a second lower electrode under the second insulating film,
   wherein:
   a contour of the third insulating film in planar view is outside a contour of the second insulating film in planar view; and
   a contour of the second upper electrode in planar view is inside the contour of the second insulating film in planar view.

10. The method according to claim 9, wherein each of the first insulating film, the second insulating film, and the third insulating film is a ferroelectric film.

11. The method according to claim 9, wherein each of the first insulating film and the third insulating film includes a plurality of films.

12. The method according to claim 9, wherein a distance between the contour of the third insulating film in planar view and the contour of the second insulating film in planar view is set to be twice or more as large as a thickness of the third insulating film.

13. The method according to claim 9, wherein:
   the first lower electrode, the first insulating film, and the first upper electrode are formed in a memory cell region; and
   the second lower electrode, the second insulating film, the third insulating film, and the second upper electrode are formed in a logic circuit region.

14. The method according to claim 9, wherein the second insulating film is thicker than the first insulating film and the third insulating film.

15. The method according to claim 9, wherein an area of the second upper electrode is larger than an area of the first upper electrode.

* * * * *